US009565770B2

(12) United States Patent
Sutardja et al.

(10) Patent No.: US 9,565,770 B2
(45) Date of Patent: Feb. 7, 2017

(54) METHODS OF MAKING PACKAGES USING THIN CU FOIL SUPPORTED BY CARRIER CU FOIL

(71) Applicant: Marvell World Trade Ltd., St. Michael (BB)

(72) Inventors: Sehat Sutardja, Los Altos Hills, CA (US); Albert Wu, Palo Alto, CA (US); Hyun J Shin, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 645 days.

(21) Appl. No.: 13/962,731

(22) Filed: Aug. 8, 2013

(65) Prior Publication Data
US 2014/0041916 A1    Feb. 13, 2014

Related U.S. Application Data

(60) Provisional application No. 61/680,943, filed on Aug. 8, 2012, provisional application No. 61/680,932, filed on Aug. 8, 2012.

(51) Int. Cl.
| H05K 1/16 | (2006.01) |
| H05K 3/00 | (2006.01) |
| H05K 1/18 | (2006.01) |
| H01L 21/48 | (2006.01) |
| H01L 21/56 | (2006.01) |
| H01L 23/31 | (2006.01) |

(52) U.S. Cl.
CPC .......... *H05K 3/007* (2013.01); *H01L 21/4832* (2013.01); *H01L 21/568* (2013.01); *H05K 1/182* (2013.01); *H01L 23/3107* (2013.01); *H01L 2224/32245* (2013.01); *H01L 2224/4809* (2013.01); *H01L 2224/48091* (2013.01); *H01L 2224/48247* (2013.01); *H01L 2224/73265* (2013.01); *H01L 2924/181* (2013.01); *Y10T 29/49146* (2015.01)

(58) Field of Classification Search
CPC ..... H05K 1/182; H05K 3/07; Y10T 29/49146; H01L 23/3107; H01L 21/4832; H01L 21/568
USPC ................ 174/260, 250, 251, 255, 257, 258
See application file for complete search history.

(56) References Cited

U.S. PATENT DOCUMENTS

| 5,200,362 | A | 4/1993 | Lin et al. |
| 6,333,252 | B1 | 12/2001 | Jung et al. |
| 6,342,730 | B1 | 1/2002 | Jung et al. |
| 6,358,847 | B1 * | 3/2002 | Li .............................. B08B 1/04 257/E21.251 |
| 7,270,867 | B1 | 9/2007 | Kwan et al. |
| 2004/0018659 | A1 | 1/2004 | Hosokawa et al. |

(Continued)

FOREIGN PATENT DOCUMENTS

JP     S59208756     11/1984

*Primary Examiner* — Tremesha S Willis

(57) ABSTRACT

In an embodiment, there is provided a method of creating a package, the method comprising: providing an initial substrate, wherein the initial substrate comprises a carrier foil, a functional copper foil, and an interface release layer between the carrier foil and the functional copper foil; building up copper portions on the functional copper foil; attaching a chip to a first copper portion; coupling the chip to a second copper portion; encapsulating at least the chip and the copper portions with a mold; and removing the carrier foil and interface release layer.

19 Claims, 16 Drawing Sheets

(56) References Cited

U.S. PATENT DOCUMENTS

2004/0097081 A1    5/2004   Igarashi et al.

* cited by examiner

METHODS OF MAKING PACKAGES USING THIN CU FOIL SUPPORTED BY CARRIER CU FOIL

CROSS-REFERENCES TO RELATED APPLICATIONS

The present disclosure claims priority to U.S. Provisional Patent Application No. 61/680,943, filed Aug. 8, 2012, and to U.S. Provisional Patent Application No. 61/680,932, filed Aug. 8, 2012, the disclosures of which are hereby incorporated by reference.

TECHNICAL FIELD

Embodiments of the present disclosure relate to the field of integrated circuits, and more particularly, to techniques, structures, and configurations for semiconductor chip packaging.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Microelectronic devices utilize packing arrangements that continue to become smaller and smaller. As such packaging arrangements become smaller, the stability and physical strength associated with such packages can become compromised. For example, creating packages with a peelable carrier foil that is removed upon completion of the package can leave the bottom of the package fairly flimsy. Thus, a mold can be provided that encompasses the package to thereby provide additional strength for the package. However, when the peelable carrier foil is removed upon completion of the package, various components may be pulled or "popped" out of the mold with the removal of the peelable carrier foil.

SUMMARY

In an embodiment, there is provided a method of creating a package, the method comprising: providing an initial substrate, wherein the initial substrate comprises a carrier foil, a functional copper foil, and an interface release layer between the carrier foil and the functional copper foil; building up copper portions on the functional copper foil; attaching a chip to a first copper portion; coupling the chip to a second copper portion; encapsulating at least the chip and the copper portions with a mold; and removing the carrier foil and interface release layer.

In an embodiment, there is provided a package comprising a functional copper foil; copper portions attached to the functional copper foil; a chip attached to a first copper portion, wherein the chip is coupled to a second copper portion; a mold encapsulating at least the chip and the copper portions, wherein portions of the functional copper foil between the copper portions are removed such that a bottom surface of each copper portion is exposed, and wherein the mold encapsulates the copper portions between the exposed bottom surfaces of the copper portions and the functional copper foil.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION

FIGS. 1A-1H illustrate various steps for creating a single layer package 100 in accordance with various embodiments. With respect to FIG. 1A, an initial substrate is illustrated that utilizes a thin copper foil supported by a carrier foil during manufacture of the single-layer package. The initial substrate includes a carrier copper foil 102 that is peelable. The carrier copper foil 102 may be made of a different metal in other embodiments. An interface release layer 104 couples the carrier copper foil 102 to a thin functional copper foil 106. The interface release layer 104 is generally made of chromium or a similar material. The interface release layer 104 prevents sticking of the thin functional copper foil 106 to the carrier copper foil 102, which is peelable, and thus, allows for peeling and easier release of the copper carrier foil 102 from the thin functional copper foil 106. Generally, the thin functional copper foil 106 has a thickness of just a few microns, while the carrier copper foil 102 has a thickness in the tens of microns.

Figure 1A:
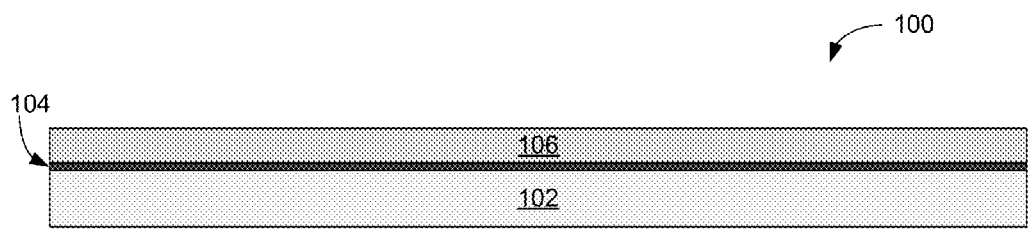
FIGS. 1A-1H schematically illustrate various steps for creating a single layer package, in accordance with various embodiments.
Figure 1B:
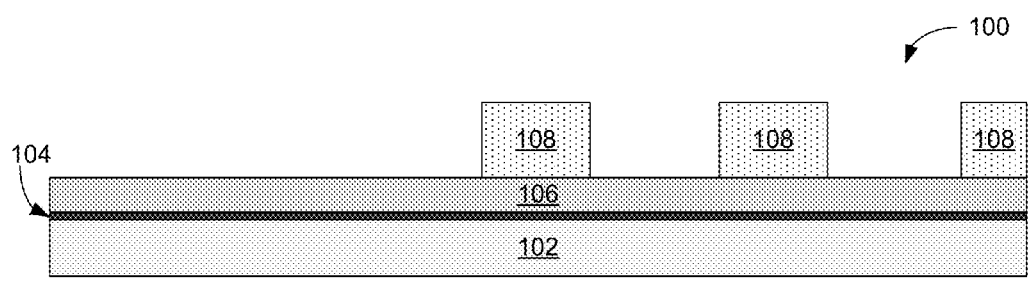
Figure 1C:
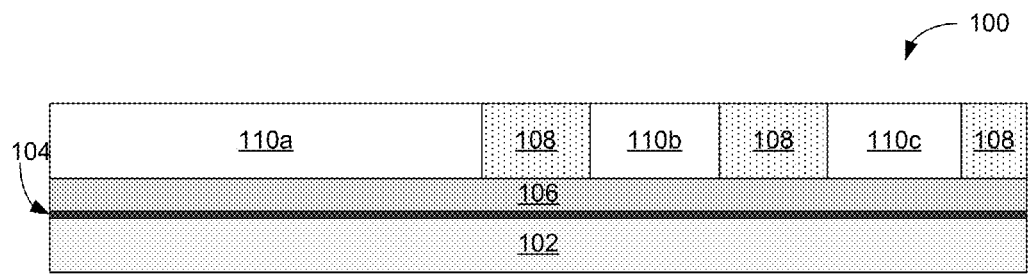

FIG. 1B illustrates a photolithography step wherein a layer of photoresist (not illustrated) is developed, thereby resulting in a pattern of photoresist portions 108. FIG. 1C illustrates a step of copper plating on the thin functional copper foil 106, thereby resulting in copper portions 110a, 110b, 110c located between the photoresist portions 108. The arrangement of photoresist portions 108 and copper portions 110a, 110b, 110c illustrated in FIGS. 1B and 1C is merely an example and is not meant to be limiting. More or fewer photoresist portions 108 and copper portions 110a, 110b, 110c can be included if desired.

Figure 1D:
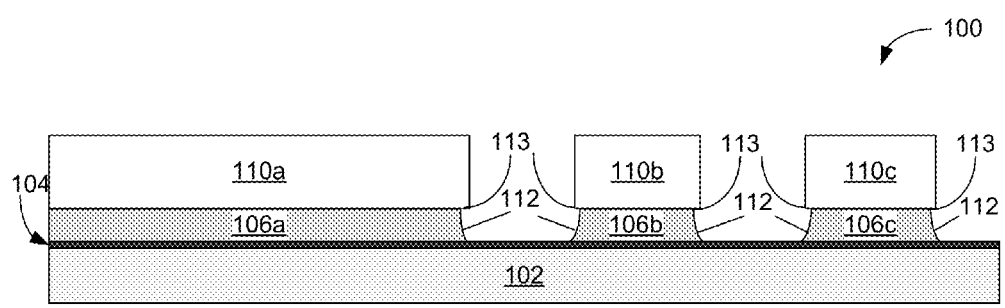

FIG. 1D illustrates a step of stripping and etching of the photoresist portions 108, which results in the removal of the photoresist portions 108. As can be seen, the stripping and etching results in grooves or valleys 112 located within the thin functional copper foil 106 below the plated copper portions 110a, 110b, 110c such that portions of bottom surfaces 113 of the plated copper portions 110a, 110b, 110c, are exposed over the grooves 112. The stripping and etching process also creates portions 106a, 106b, 106c from the thin functional copper foil 106. The interface release layer 104 helps provide an inherent etch stop mechanism to help prevent over etching.

Figure 1E:
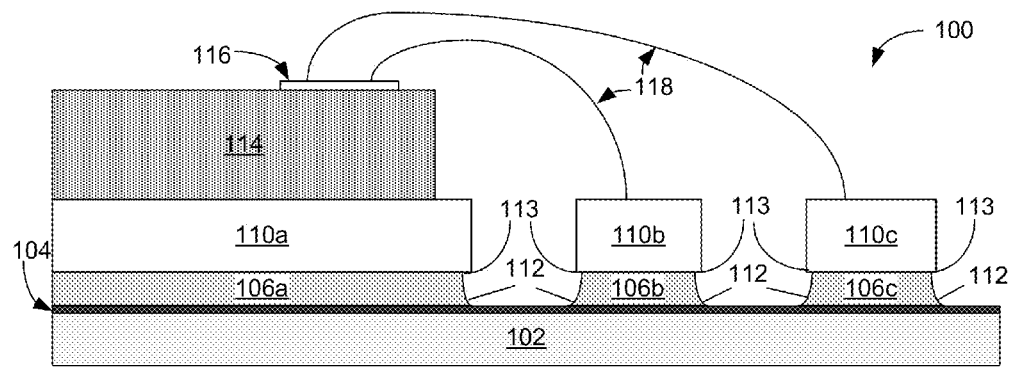

FIG. 1E illustrates a step of attaching chip 114 to copper portion 110a. The chip 114 can be attached to the copper portion 110a via an appropriate epoxy or glue (not illustrated). Alternatively, the chip 114 can be attached to the copper portion 110a via a flip chip attach process and, thus, would have direct electrical connection(s) with the copper portion 110a via solder (not illustrated). The chip 114 includes a bond pad 116. A wire bonding process results in wires 118 being routed from the bond pad 116 to the copper portions 110b, 110c.

Figure 1F:
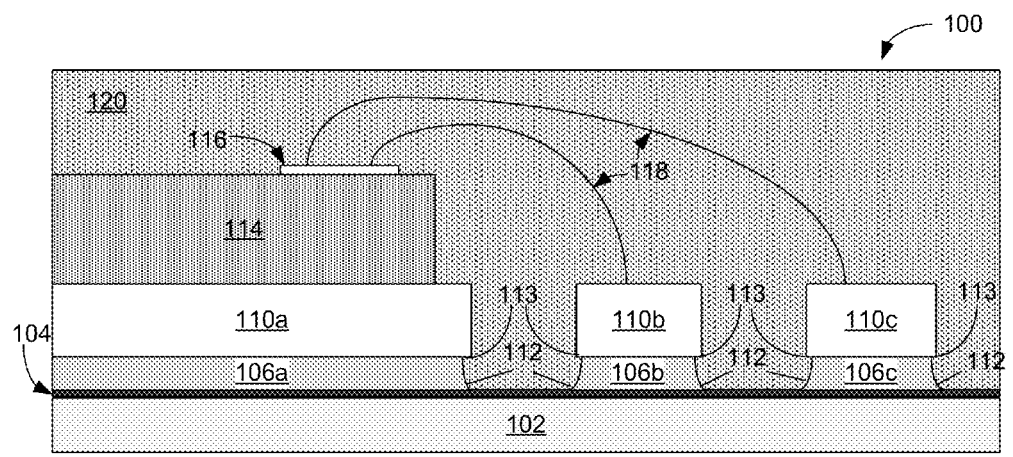

FIG. 1F illustrates a molding step that results in a mold 120 that encapsulates and protects the package 100. The mold 120 can be made of plastic or other suitable material. As can be seen, the mold 120 covers the chip 114 and bond pad 116, as well as the wires 118. The mold 120 also fills in along the sides of the various components and in between the copper portions 110a, 110b, 110c and the portions of the thin functional copper foil 106a, 106b, 106c.

Figure 1G:
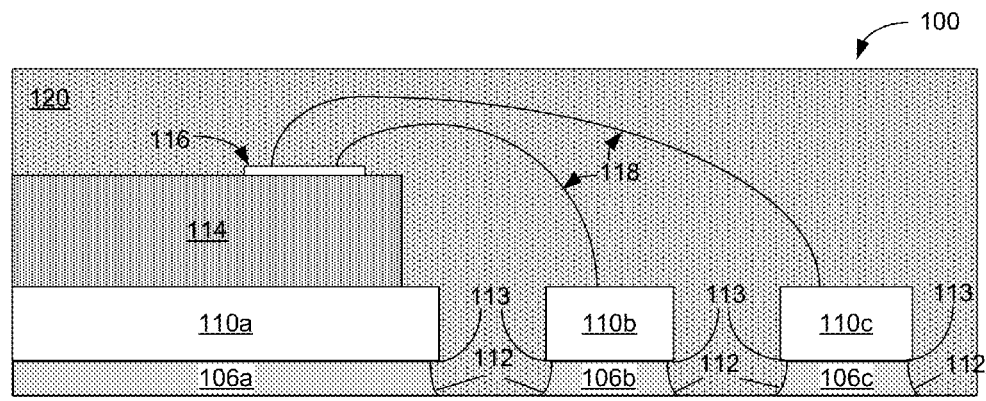

FIG. 1G illustrates a step of removing the carrier copper foil 102 to complete the package 100. Removal of the carrier copper foil 102 is facilitated by and results in the removal of the interface release layer 104. Removal of the carrier copper foil 102 can be achieved by heating the package 100 at a medium temperature to release the interface release layer 104. The carrier copper foil 102 can then be peeled away from the functional copper portions 106a, 106b, 106c and the mold 120.

As previously discussed, sometimes upon removal of the carrier copper foil from conventional packaging, various components similar to, for example, the copper portions 110b, 110c and the corresponding thin functional copper portions 106b, 106c, are pulled or "popped" out of the mold. However, in embodiments of the present disclosure, the exposed bottom surfaces 113 of the copper portions 110b, 110c that extend over the grooves 112 help inhibit removal or "popping" out of the copper portions 110b, 110c and the corresponding thin functional copper portions 106b, 106c. The copper portion 110a also has an exposed bottom surface 113 that inhibits "popping" out of the copper portion 110a.

Figure 1H:
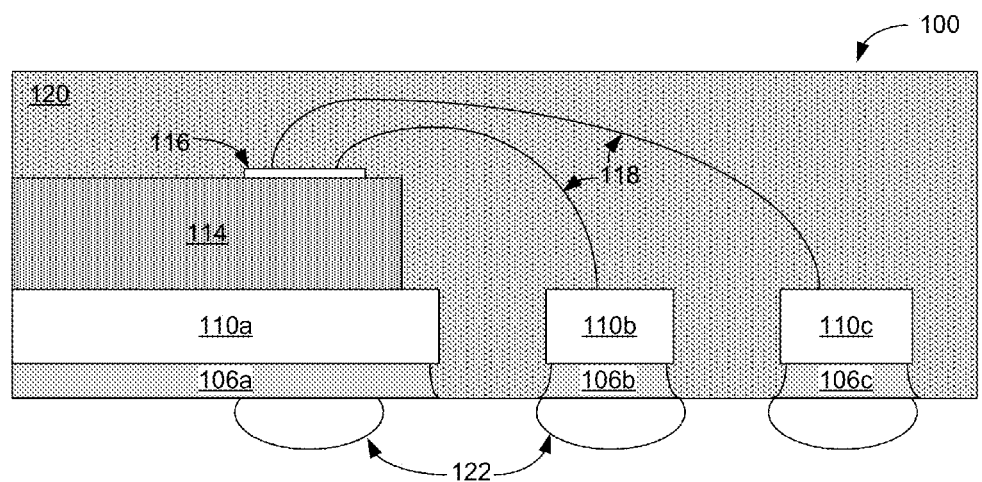

With respect to FIG. 1H, solder balls 122 are attached to the thin functional copper portions 106a, 106b, 106c to facilitate attachment of the resulting single-layer package 100 to a substrate such as, for example, a printed circuit board (PCB), another package, etc. (not illustrated). The solder balls 122 also provide direct electronic connections between the thin functional copper portions 106a, 106b, 106c and the substrate (not illustrated).

Figure 1I:
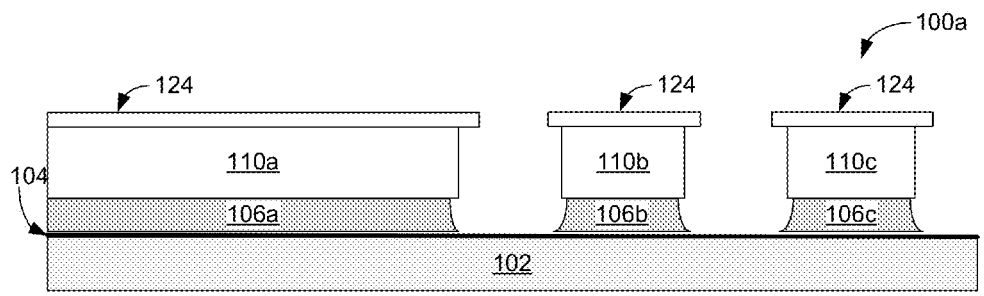
FIGS. 1I-1K and 4 illustrate an additional step that can be performed to create another single layer package, in accordance with various embodiments.
Figure 1J:
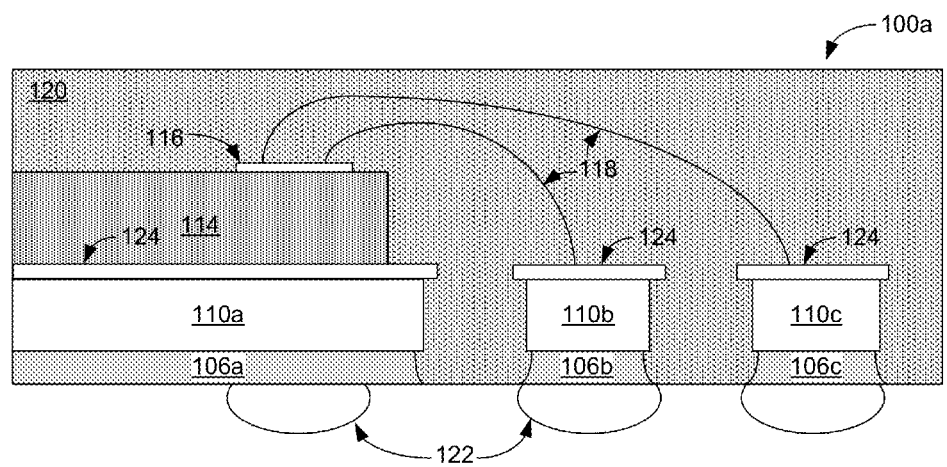

FIG. 1I illustrates an optional step that can be performed after the copper plating step illustrated with respect to FIG. 1C. A hard metal layer stack may be performed to add metal portions 124 on the copper portions 110a, 110b, 110c. However, in an embodiment, for example, such metal portions 124 are optional, and are absent on one or more of the copper portions 110a, 110b, 110c (e.g., absent on the copper portion 110a, although not illustrated in FIG. 1I). These hard metal portions 124 can be etched in order to provide the elongated shape illustrated in FIG. 1I. As can be seen, the hard metal portions 124 are wider than the copper portions 110a, 110b, 110c. The remaining steps described with respect to FIGS. 1D-1H are then performed. This results in a package 100a illustrated in FIG. 1J. The hard metal layer portions 124 provide further mechanical assistance in preventing the copper portions 110a, 110b, 110c and corresponding thin functional copper portions 106a, 106b, 106c from popping out during removal of the peelable carrier copper foil 102, as described with respect to FIG. 1G.

Figure 4:
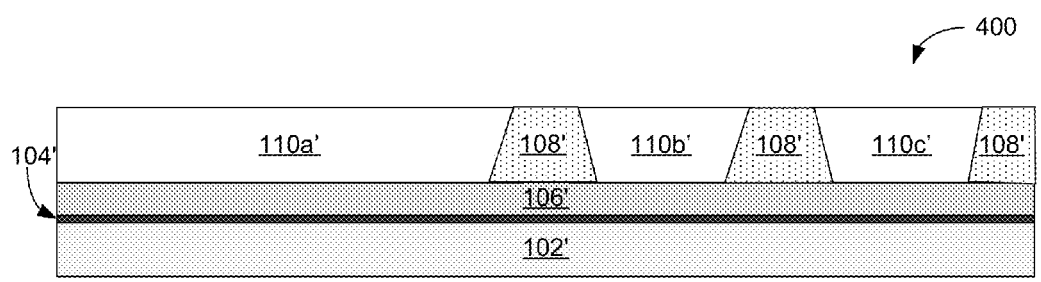

FIGS. 1B-1C illustrate a rectangular shape for the photoresist portions 108, and FIGS. 1B-1J illustrate the walls of the copper portions 110a, 110b, 110c to be perpendicular to the carrier copper foil 102. However, in other embodiments, the photoresist portions 108 can have any other appropriate shape, and accordingly, the walls of the copper portions 110a, 110b, 110c may not be perpendicular to the carrier copper foil 102. For example, FIG. 4 illustrates an embodiment in which photoresist portions 108' (which may be, other than the shape, similar to the photoresist portions 108 of FIG. 1C) may have trapezoidal shapes. FIG. 4 is similar to FIG. 1C, except for the difference in the shapes of various components in these two figures. In FIG. 4, as walls of the photoresist portions 108' are not perpendicular to the carrier copper foil 106', walls of copper portions 110a', 110b', 110c' are also not perpendicular to the carrier copper foil 106'. The remaining steps described with respect to FIGS. 1D-1J are then performed on the package 100' of FIG. 4.

Figure 1K:
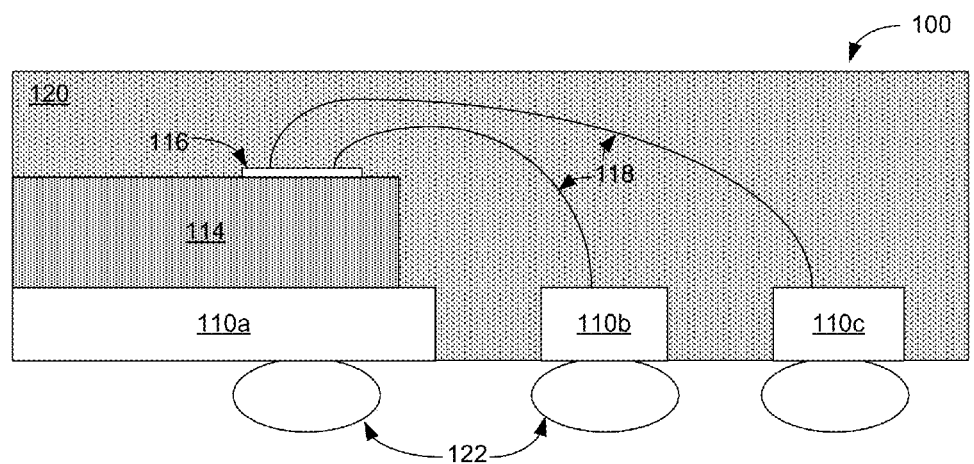

In FIGS. 1A-1J, the carrier copper foil 102 acts as a carrier layer and comprises copper, and the thin functional copper foil 106 comprises copper. In another embodiment, the thin functional copper foil 106 is replaced by, for example, thin aluminum foil (e.g., the foil 106 becomes a thin aluminum layer). In such an embodiment, portions of the aluminum layer 106 can be oxidized (e.g., using anodization) to form aluminum oxide. For example, referring to FIG. 1B, portions of the aluminum layer 106 underneath the photoresist portions 108 are preserved, while the remaining portions of the aluminum layer 106 that are not covered by any photoresist portions 108 are oxidized to form aluminum oxide portions. Consequently, a preserved portion of the aluminum layer 106 is sandwiched between aluminum oxide portions. The aluminum oxide portions then create a natural mask for subsequent copper plating (although, in an embodiment, the aluminum layer is prepared before such oxidation and/or copper plating). The photoresist portions 108 are then removed and copper portions 110 are then deposited in the space previously occupied by the photoresist portions 108. A copper portion 110 is thus isolated by the aluminum oxide portions. It should be noted that in the embodiment where the aluminum layer is used in lieu of the thin functional copper foil, the photoresist portions are used to create space for the copper portions. Thus, these photoresist portions may be larger than the photoresist portions used in connection with the process described in FIG. 1B. In such an embodiment, once the package is assembled (e.g., subsequent to depositing the mold 120 in FIG. 1F), the carrier copper foil 102 is removed (e.g., similar to FIG. 1G). The left over aluminum layer 106 (e.g., illustrated as layers 106a, 106b, 106c is FIGS. 1G and 1H) under the copper portions 110a, 110b, 110c are then etched away by chemical reaction, leaving a bottom surface of the copper portions 110a, 110b, 110c exposed. For example, as illustrated in FIG. 1K, the carrier copper foil 102 and the layers 106a, 106b, 106c are removed, leaving the bottom surface of the copper portions 110a, 110b, 110c exposed. Then solder balls 122 are attached to the exposed bottom surface of the copper portions 110a, 110b, 110c, as illustrated in FIG. 1K. In another embodiment, instead of attaching solder balls 122 to the exposed bottom surface of the copper portions 110a, 110b, 110c, a thin layer of solder is applied to the exposed bottom surface of the copper portions 110a, 110b, 110c.

In the embodiment of FIGS. 1A-1K, the carrier copper foil 102 comprises copper. However, in another embodiment, the carrier copper foil 102 is replaced by a carrier aluminum foil (i.e., aluminum is used instead of copper to form the carrier foil 102), which may, for example, lead to lowering the cost of the semiconductor package. In such an embodiment, the thin functional copper foil 106 is not used; instead, a single aluminum layer or carrier aluminum foil is used. Similarly, aluminum oxide portions are created using the aluminum layer to provide isolation between copper portions. An appropriate interface release layer 104 is used between the carrier aluminum/aluminum layer and the copper portions in order to promote peeling/separation.

FIGS. 2A-2H illustrate various steps for creating another embodiment of a single-layer package 200 using a thin copper foil supported by a carrier foil during manufacturing. With respect to FIG. 2A, an initial substrate includes a carrier copper foil 202, which is peelable, coupled via an interface release layer 204 to a thin functional copper foil 206. The carrier copper foil can be some other type of metal. The interface release layer 204 generally includes chromium or a similar material.

Figure 2A:
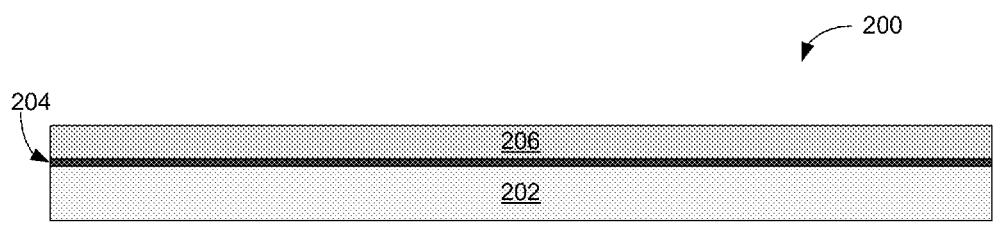
FIGS. 2A-2H schematically illustrate various steps for creating another single layer package, in accordance with various embodiments.
Figure 2B:
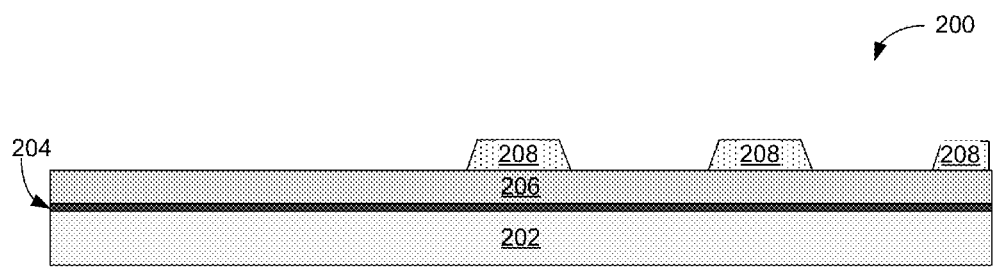
Figure 2C:
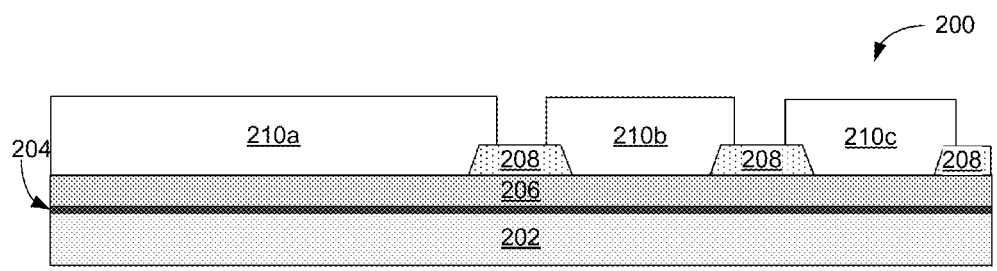

FIG. 2B illustrates a photolithography step wherein a layer of photoresist (not illustrated) is deposited and developed, thereby resulting in photoresist portions 208. FIG. 2C illustrates a step of copper plating on the thin functional copper foil 206, thereby resulting in copper portions 210a, 210b, 210c located between the photoresist portions 208. In an embodiment, at least portions of copper portions 210a, 210b, 210c are over at least portions of the photoresist portions 208, as illustrated in FIG. 2C. The arrangement of photoresist portions 208 and copper portions 210a, 210b, 210c illustrated in FIGS. 2B and 2C is merely an example and is not meant to be limiting. More or fewer photoresist portions 208 and copper portions 210a, 210b, 210c can be included if desired.

Figure 2D:
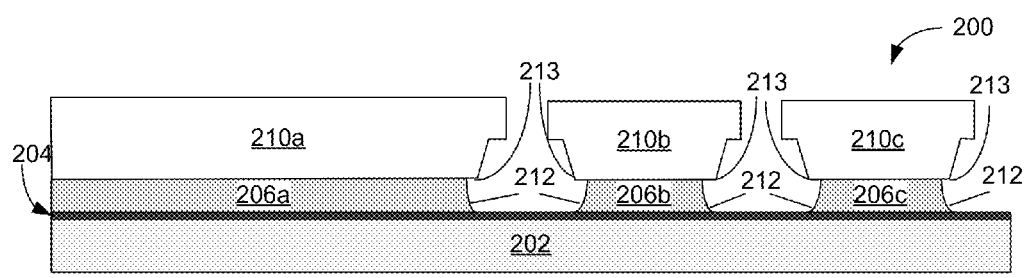

FIG. 2D illustrates a step of photoresist stripping and etching, which results in removal of the photoresist portions 208. As can be seen, the copper portions 210a, 210b, 210c generally have a mushroom shape upon completion. Thus, the top portion of the copper portions 210a, 210b, 210c is wider than the bottom portion to create a plug-like feature. As can be seen, the stripping and etching results in grooves or valleys 212 located within the thin functional copper foil 206 below the copper portions 210a, 210b, 210c such that portions of the bottom surfaces 213 of the copper portions 210a, 210b, 210c, are exposed over the grooves 212. The interface release layer 204 helps provide an inherent etch stop mechanism to help prevent over etching.

Figure 2E:
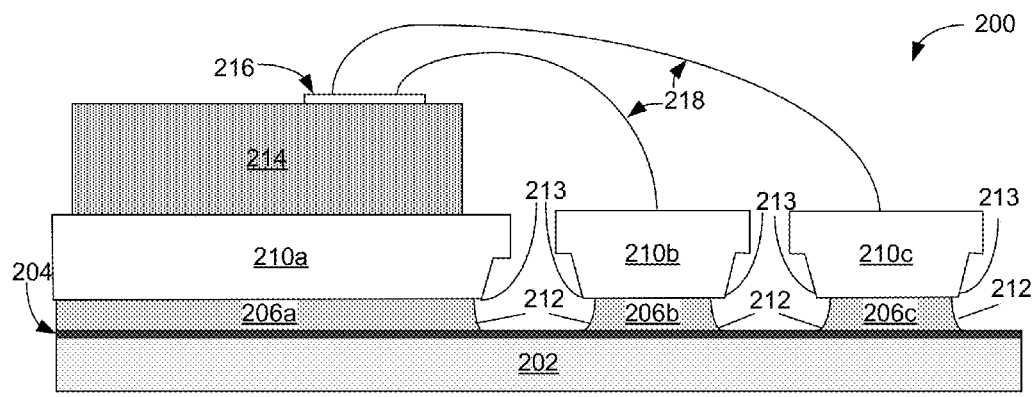

FIG. 2E illustrates a step of attaching a chip 214 to copper portion 210a. The chip 214 can be attached to the copper portion 210a via an appropriate epoxy or glue (not illustrated). Alternatively, the chip 214 can be attached to the copper portion 210a via a flip chip attach process and thus, would have direct electrical connection(s) with the copper portion 210a via solder (not illustrated). The chip 214 includes a bond pad 216. A wire bonding process results in wires 218 being routed from the bond pad 216 to the copper portions 210b, 210c.

Figure 2F:
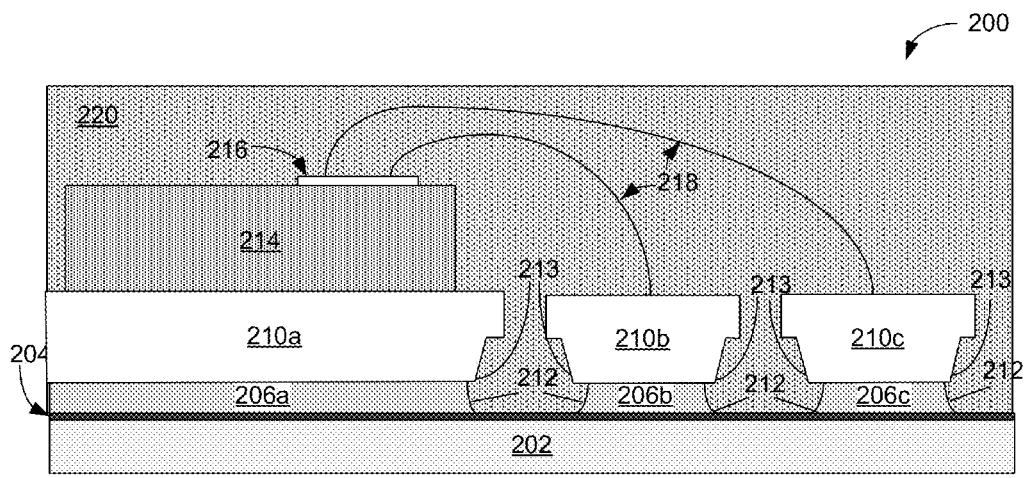

FIG. 2F illustrates a molding operation that provides a mold 220 that encapsulates and protects the package 200. The mold 220 can be made of plastic or other suitable material. As can be seen, the mold 220 covers the chip 214 and bond pad 216, as well as the wires 218. The mold 220 also fills in along the sides of the various components and in between the copper portions 210a, 210b, 210c and the portions of the thin functional copper foil 206a, 206b, 206c.

Figure 2G:
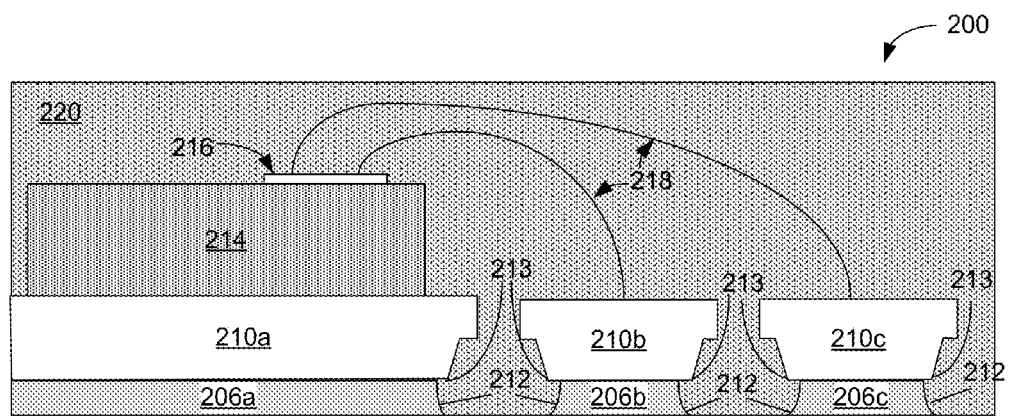

FIG. 2G illustrates a step of removing the carrier copper foil 202 to complete the package 200. Removal of the carrier copper foil 202 is facilitated by and results in the removal of the interface release layer 204. Removal of the carrier copper foil 102 can be achieved by heating the package 100 at a medium temperature to release the interface release layer 104. The carrier copper foil 102 can then be peeled away from the functional copper portions 106a, 106b, 106c and the mold 120.

As previously discussed, sometimes upon removal of the carrier copper foil from conventional packaging, various components that are similar to, for example, the copper portions 210b, 210c and the corresponding thin functional copper portions 206b, 206c, are pulled or "pop" out of the mold. However, in embodiments of the present disclosure, the exposed bottom surfaces 213 of the copper portions 210b, 210c that extend over the grooves 212 help inhibit removal or "popping" out of the copper portions 210b, 210c and the corresponding thin functional copper portions 206b, 206c. Additionally, the mushroom shape of the copper portions 210b, 210c results in the plug-like feature of the copper portions 210b, 210c that provides additional mechanical resistance to "popping" out of the copper portions 210b, 210c since the top portions of the copper portions 210b, 210c are wider than the bottom portions. The copper portion 210a also has a substantially mushroom shape on at least one side and an exposed bottom surface 213 that inhibits "popping" out of the copper portion 210a.

Figure 2H:
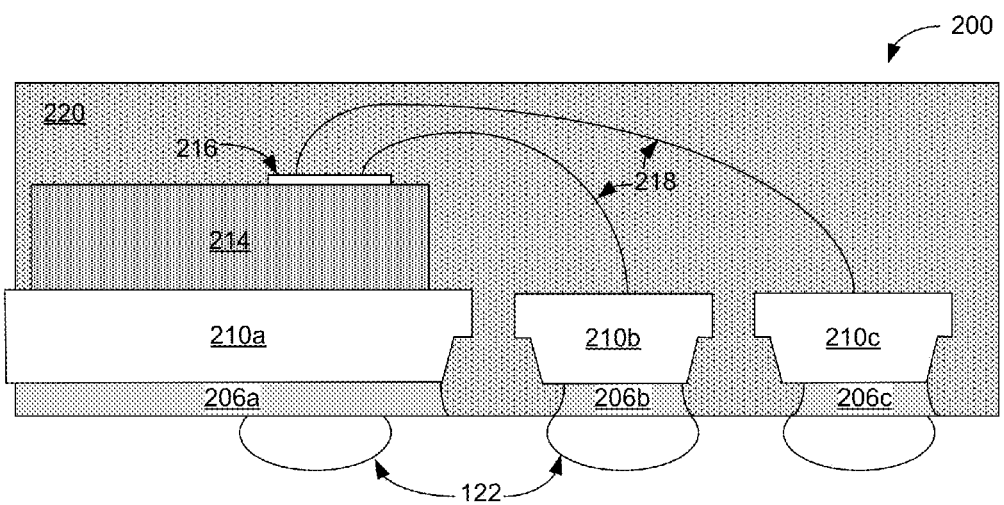

With respect to FIG. 2H, solder balls 222 are attached to the thin functional copper portions 206a, 206b, 206c to facilitate attachment of the resulting single-layer package 200 to a substrate such as, for example, a printed circuit board (PCB), another package, etc. (not illustrated). The solder balls 222 also provide direct electronic connections between the thin functional copper portions 206a, 206b, 206c and the substrate (not illustrated).

The packages 100, 100a and 200 are generally single layer ball grid array (BGA) packages. The packages 100, 100a and 200 are also referred to as quad-flat no-leads (QFN) packages.

Figure 3:
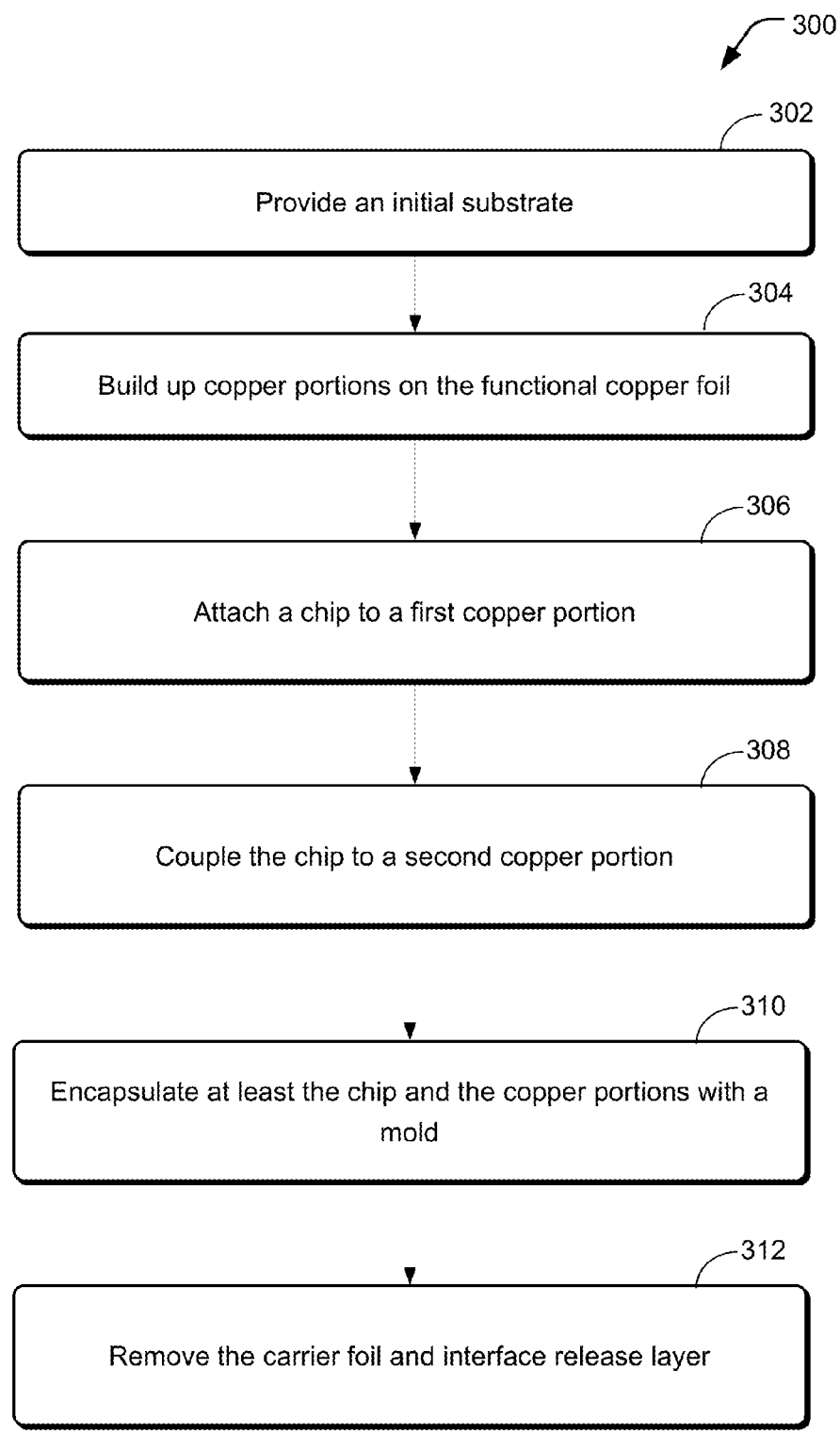
FIG. 3 is a flow diagram that illustrates an example of a method for creating single layer packages, in accordance with various embodiments.

FIG. 3 illustrates an example of a method 300 for creating a package, such as, for example, packages 100, 100a and 200. At 302, an initial substrate is provided. The initial substrate comprises a carrier foil, a functional copper foil and an interface release layer between the carrier foil and the functional copper foil. At 304, copper portions are built up on the functional copper foil. At 306, a chip is attached to a first copper portion. At 308, the chip is coupled to a second copper portion. At 310, at least the chip and the copper portions are encapsulated with a mold. At 312, the carrier foil and interface release layer are removed.

FIGS. 5A-5G illustrate various steps for creating a single layer package 500 in accordance with various embodiments. With respect to FIG. 5A, an initial substrate is illustrated that utilizes a carrier foil during manufacture of the single-layer package 500. The initial substrate includes a carrier copper foil 502 that is peelable. The carrier copper foil 502 may comprise a different metal if desired. An interface release layer 504 is coupled to the carrier copper foil 502 and generally includes chromium or a similar material. The interface release layer 504 prevents sticking of the carrier copper foil 502 to other components (not illustrated in FIG. 5A) of the package 500. More particularly, the interface layer 504 allows for peeling and easier release of the copper carrier foil 502 from the package 500 upon completion of the package 500, as will be further described herein. Generally, the carrier copper foil 502 has a thickness in the tens of microns.

Figure 5A:
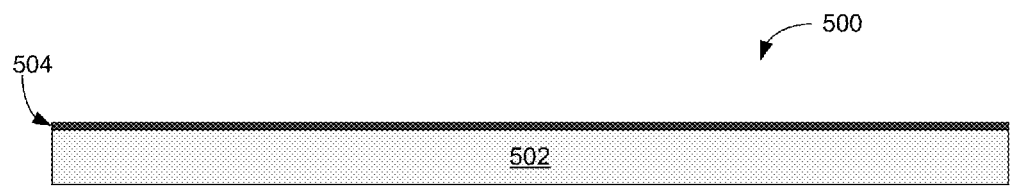
FIGS. 5A-5G schematically illustrate various steps for creating a single layer package, in accordance with various embodiments.
Figure 5B:
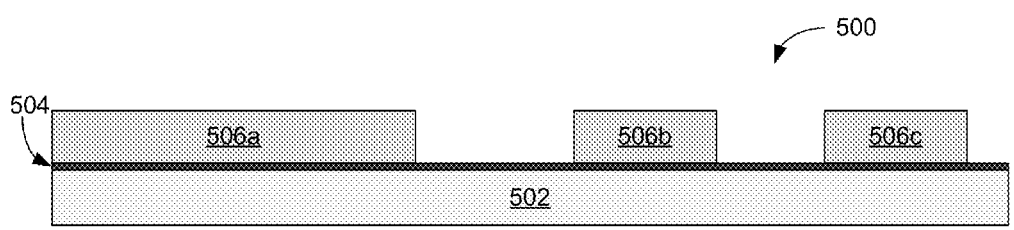

FIG. 5B illustrates a step of providing copper portions 506a, 506b, 506c on the carrier copper foil 502. The copper portions 506a, 506b, 506c are provided by depositing liquid copper nano particles onto the interface release layer 504 in a desired pattern for the package 500, similar to a printing operation. The copper portions 506a, 506b, 506c are then cured or dried in order to solidify the copper portions 506a, 506b, 506c. The arrangement of copper portions 506a, 506b, 506c illustrated in FIG. 5B is merely an example and is not meant to be limiting. More or fewer copper portions 506a, 506b, 506c can be included if desired depending upon the design of the package 500.

Figure 5C:
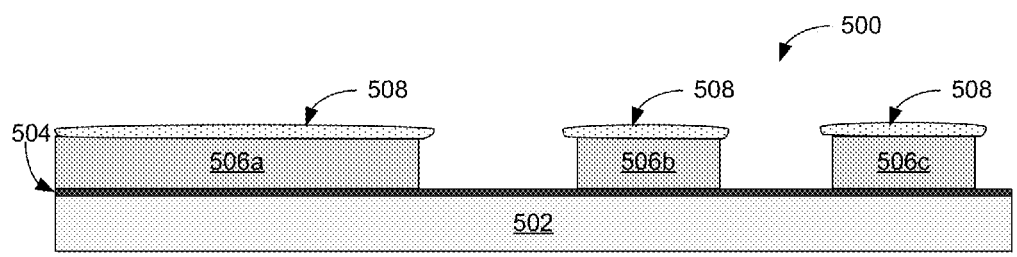

FIG. 5C illustrates an optional step of providing a conductive top 508 on each copper portion 506a, 506b, 506c. The conductive tops 508 can be provided by a dendrite formation of portions of a conductive material such as for example, copper, gold, silver, etc. Thus, the conductive tops 508 are generally grown on the copper portions 506a, 506b, 506c. As can be seen, the conductive tops 508 are wider than the copper portions 506a, 506b, 506c. The conductive tops 508 provide mechanical assistance in preventing the copper portions 506a, 506b, 506c from popping out during removal of the peelable carrier copper foil 502, as will be described herein.

Figure 5D:
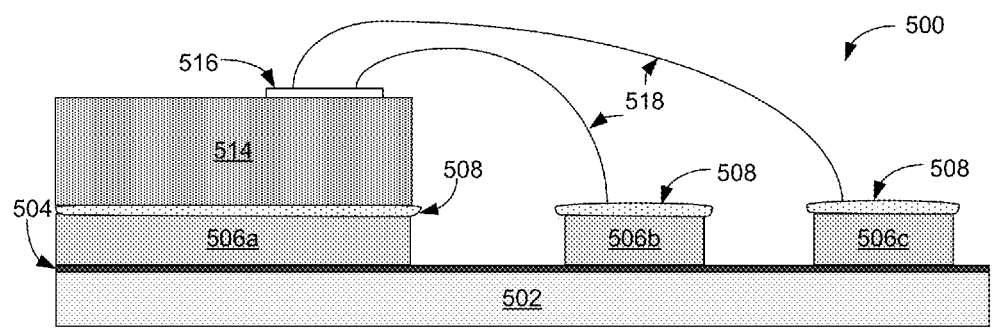

FIG. 5D illustrates a step of attaching a chip 514 to copper portion 506a. The chip 514 can be attached to the copper portion 506a via an appropriate epoxy or glue (not illustrated). Alternatively, the chip 514 can be attached to the copper portion 506a via a flip chip attach process and thus, would have direct electrical connection(s) with the copper portion 506a via solder (not illustrated). The chip 514 includes a bond pad 516. A wire bonding process results in wires 518 being routed from the bond pad 516 to the copper portions 506b, 506c.

Figure 5E:
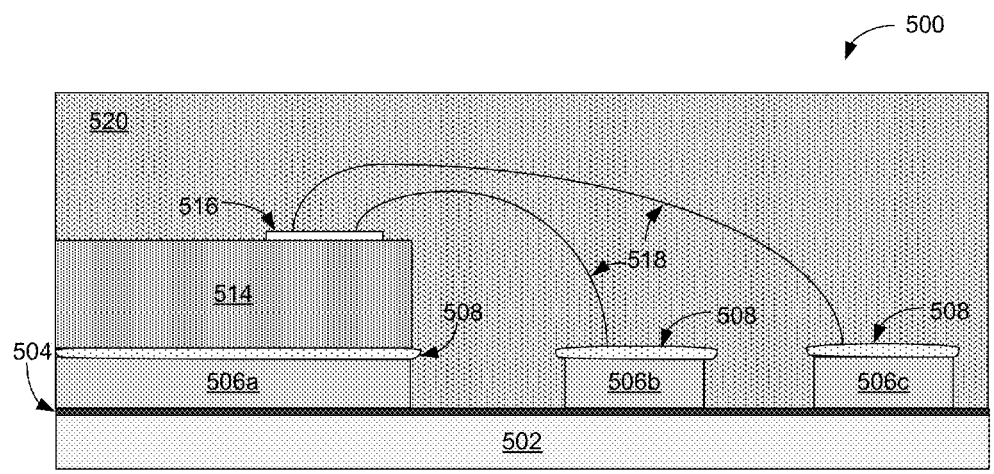

FIG. 5E illustrates a molding step that results in a mold 520 that encapsulates and protects the package 500. The mold 520 can be made of plastic or other suitable material. As can be seen, the mold 520 covers the chip 514 and bond pad 516, as well as the wires 518. The mold 520 also fills in among and over the various components, including the copper portions 506a, 506b, 506c.

Figure 5F:
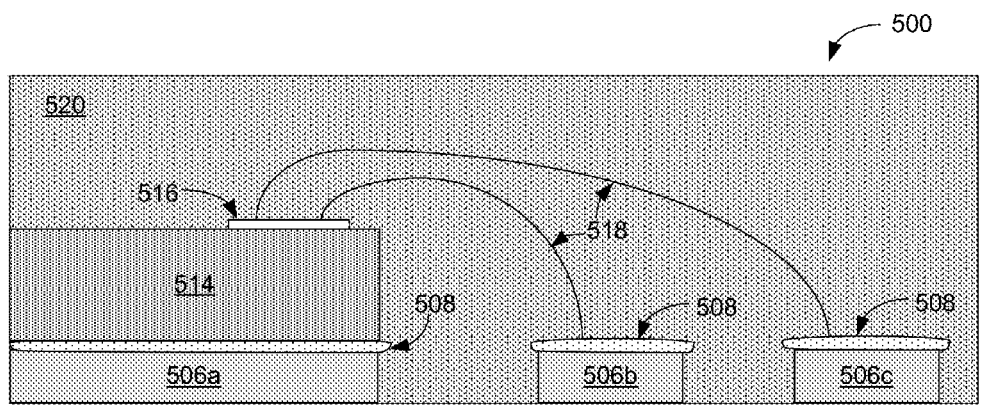

FIG. 5F illustrates a step of removing the carrier copper foil 502 to complete the package 500. Removal of the carrier copper foil 502 is facilitated by and results in the removal of the interface release layer 504. Removal of the carrier copper foil 502 can be achieved by heating the package 500 at a medium temperature to release the interface release layer 504. The carrier copper foil 502 can then be peeled away from the copper portions 506a, 506b, 506c and the mold 520.

As previously discussed, sometimes upon removal of a carrier copper foil from conventional packaging, various components similar to, for example, the copper portions 506a, 506b, 506c, are pulled or "popped" out of the mold. However, in embodiments of the present disclosure where conductive tops 508 are included, the conductive tops 508 on the copper portions 506a, 506b, 506c help inhibit removal or "popping" out of the copper portions 506a, 506b, 506c. This is due in part to the width of the conductive tops 508 and the mold 520 encapsulating and "grabbing" the conductive tops 508 in conjunction with the copper portions 506a, 506b, 506c. In accordance with various embodiments not illustrated in the figures, the copper portion 506a does not include a conductive top 508 since the presence of the chip 514 in combination with the copper portion 506a inhibits "popping" out of the chip 514 and the corresponding copper portion 506a.

Figure 5G:
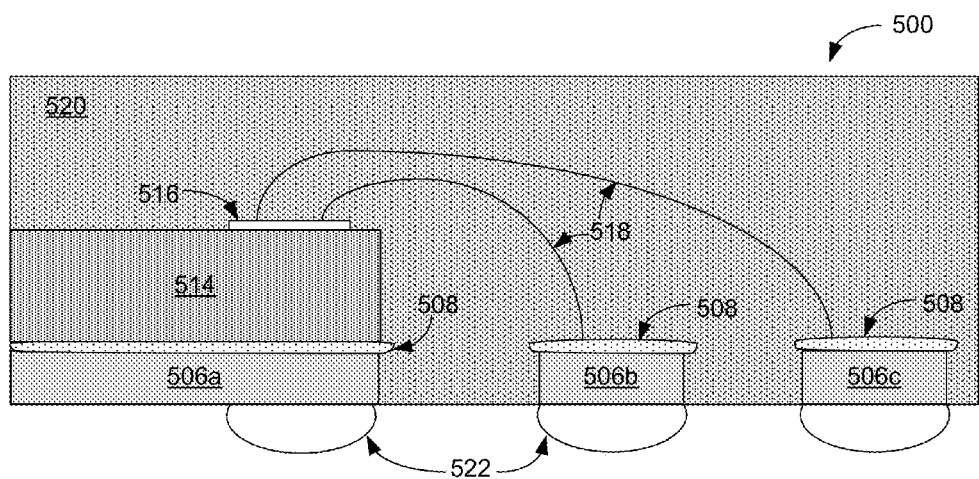

With respect to FIG. 5G, solder balls 522 are attached to the copper portions 506a, 506b, 506c to facilitate attachment of the resulting single-layer package 500 to a substrate such as, for example, a printed circuit board (PCB), another package, etc. (not illustrated). If a solder ball 522 does not fully cover a surface of a corresponding copper portion 506a, 506b, 506c, then a mask (not illustrated) may be provided to cover exposed portions of the surface of the corresponding copper portion 506a, 506b, 506c in order to protect the exposed portions of the surface of the corresponding copper portion 506a, 506b, 506c. The solder balls 522 also provide direct electronic connections between the copper portions 506a, 506b, 506c and the substrate (not illustrated).

The package 500 is generally a single layer ball grid array (BGA) package. The package 500 is also referred to as a quad-flat no-leads (QFN) package.

Figure 6:
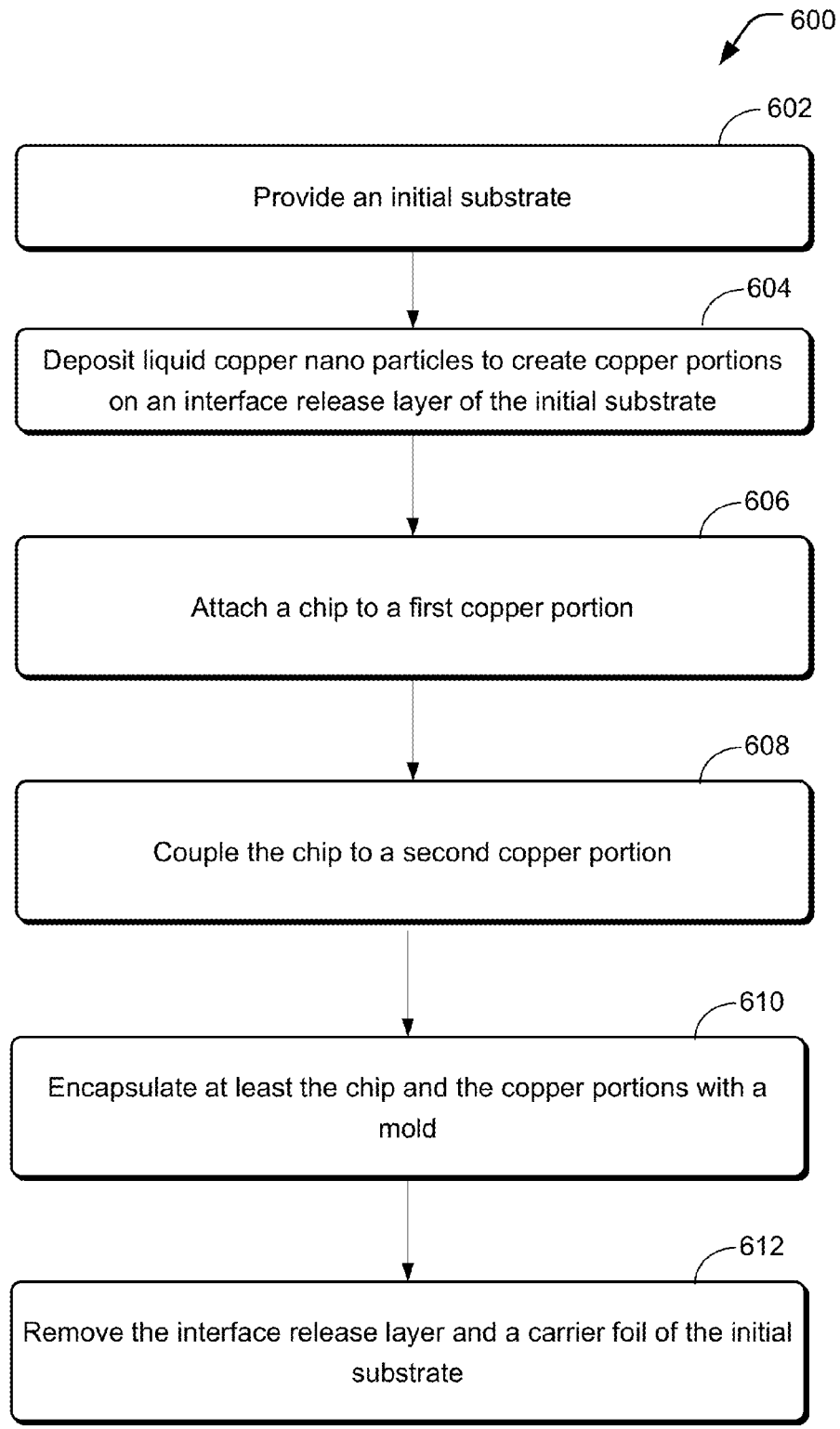
FIG. 6 is a flow diagram that illustrates an example of a method for creating single layer packages, in accordance with various embodiments.

FIG. 6 illustrates an example of a method 600 for creating a package, such as, for example, package 500. At 602, an initial substrate is provided. The initial substrate comprises a carrier foil and an interface release layer coupled to the carrier foil. At 604, copper portions are deposited on the interface release layer. The depositing comprises (i) depositing liquid copper nano particles on the interface release layer in a predetermined pattern and (ii) curing the liquid copper nano particles. At 606, a chip is attached to a first copper portion. At 608, the chip is coupled to a second copper portion. At 610, at least the chip and the copper portions are encapsulated with a mold. At 612, the carrier foil and interface release layer are removed.

The disclosure described above may be used to build leadframes for multi-row QFN (quad-flat no-leads) or single layer BGA (ball grid array). The leadframe itself is built on a copper layer by etching the pattern that a user desires. A chip would then be mounted onto the leadframe with the carrier foil still attached. Wirebonding or flip chip soldering can be used to provide connections between the chip and the leadframe. Plastic molding or encapsulation is then used to seal the entire package. Subsequently, the carrier foil is peeled off or removed and solder connections may be added as desired.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the terms "embodiment" or "embodiments," which may each refer to one or more of the same or different embodiments. Furthermore, the terms "comprising," "including," "having," and the like, as used with respect to embodiments, are synonymous.

Although certain embodiments have been illustrated and described herein, it will be appreciated by those of ordinary skill in the art that a wide variety of alternate and/or equivalent embodiments or implementations calculated to achieve the same purposes may be substituted for the embodiments illustrated and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A method of creating a package, the method comprising:
   providing an initial substrate, wherein the initial substrate comprises
      a first foil,
      a second foil, and
      an interface release layer between the first foil and the second foil, wherein the interface release layer is configured to allow subsequent peeling and releasing of the first foil from the second foil;
   building up a plurality of copper portions on the second foil;
   attaching a chip to a first copper portion of the plurality of copper portions;
   coupling the chip to a second copper portion of the plurality of copper portions;
   encapsulating at least the chip and the plurality of copper portions with a mold; and
   subsequent to encapsulating at least the chip and the plurality of copper portions with the mold, removing the first foil and interface release layer from the package.

2. The method of claim 1, wherein building up the plurality of copper portions comprises:
   performing a photolithography operation to create portions of photoresist material;
   plating copper between the portions of photo resist material; and
   removing the portions of photoresist material to create the plurality of copper portions.

3. The method of claim 2, wherein removing the portions of photoresist material includes removing portions of the second foil between the plurality of copper portions.

4. The method of claim 3, wherein removing portions of the second foil between the plurality of copper portions includes removing portions of the second foil between the plurality of copper portions such that portions of the second foil below the plurality of copper portions are removed to thereby expose a bottom surface of each copper portion.

5. The method of claim 4, wherein encapsulating at least the chip and the plurality of copper portions with a mold includes encapsulating at least the chip and the plurality of copper portions with the mold such that portions of the mold are located between the second foil and the exposed bottom surfaces of the plurality of copper portions.

6. The method of claim 1, further comprising forming a metal portion on the second copper portion, wherein the metal portion is wider than the second copper portion.

7. A method of creating a package, the method comprising:
   providing an initial substrate, wherein the initial substrate comprises
      a first foil,
      a second foil, and
      an interface release layer between the first foil and the second foil;
   building up plurality of copper portions on the second foil;
   attaching a chip to a first copper portion;
   coupling the chip to a second copper portion;
   encapsulating at least the chip and the plurality of copper portions with a mold; and
   removing the first foil and interface release layer, wherein removing the first foil and interface release layer comprises:
      heating the package to release the interface release layer from the second foil thereby releasing the first foil.

8. A method of creating a package, the method comprising:
   providing an initial substrate, wherein the initial substrate comprises
      a first foil, wherein the first foil comprises a carrier copper foil,
      a second foil, and
      an interface release layer between the first foil and the second foil;
   building up plurality of copper portions on the second foil;
   attaching a chip to a first copper portion;
   coupling the chip to a second copper portion;
   encapsulating at least the chip and the plurality of copper portions with a mold; and
   removing the first foil and interface release layer.

9. The method of claim 1, wherein the interface release layer comprises chromium.

10. The method of claim 1, wherein coupling the chip to the second copper portion comprises coupling the chip to the second copper portion via a wire bonding process.

11. The method of claim 1, wherein attaching the chip to the first copper portion comprises attaching the chip to the first copper portion via a flip chip attach process.

12. The method of claim 1, wherein attaching the chip to the first copper portion comprises attaching the chip to the first copper portion via an epoxy or glue.

13. The method of claim 1, further comprising attaching solder balls to the second foil under the plurality of copper portions.

14. The method of claim 1, wherein building up plurality of copper portions on the second foil comprises forming the plurality of copper portions such that a first portion of at least the second copper portion is wider than a second portion of the second copper portion, wherein the second portion is adjacent to the second foil.

15. The method of claim 1, wherein the first foil comprises a carrier aluminum foil.

16. The method of claim 1, wherein the second foil comprises a functional copper foil.

17. The method of claim 1, wherein the second foil comprises a functional aluminum foil.

18. The method of claim 1, wherein removing the first foil and interface release layer comprises:
   peeling the first foil to remove the first foil and the interface release layer from the second foil.

19. The method of claim 1, wherein removing the first foil and interface release layer comprises:
   heating the interface release layer; and
   based on heating the interface release layer, peeling the first foil to remove the first foil and the interface release layer from the second foil.

* * * * *